US012537158B2

(12) United States Patent
Wieland

(10) Patent No.: US 12,537,158 B2
(45) Date of Patent: Jan. 27, 2026

(54) CHARGED PARTICLE ASSESSMENT TOOL, INSPECTION METHOD

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 18/123,216

(22) Filed: Mar. 17, 2023

(65) Prior Publication Data

US 2023/0230795 A1 Jul. 20, 2023

Related U.S. Application Data

(63) Continuation of application No. PCT/EP2021/075019, filed on Sep. 10, 2021.

(30) Foreign Application Priority Data

Sep. 17, 2020 (EP) .................................... 20196716
Mar. 31, 2021 (EP) .................................... 21166205
Aug. 17, 2021 (EP) .................................... 21191725

(51) Int. Cl.
*H01J 37/12* (2006.01)
*H01J 37/28* (2006.01)

(52) U.S. Cl.
CPC .............. *H01J 37/12* (2013.01); *H01J 37/28* (2013.01); *H01J 2237/04756* (2013.01)

(58) Field of Classification Search
CPC .. H01J 37/00; H01J 37/02; H01J 37/12; H01J 37/28; H01J 37/10; H01J 37/04;
(Continued)

(56) References Cited

U.S. PATENT DOCUMENTS 9,922,796 B1 3/2018 Frosien et al.
10,176,965 B1 * 1/2019 Breuer ................. H01J 37/153
(Continued)

FOREIGN PATENT DOCUMENTS

JP S61-42132 A 2/1986
JP H11-3676 A 1/1999
(Continued)

OTHER PUBLICATIONS

International Search Report issued in related Foreign Application No. PCT/EP2021/075019; mailed Mar. 7, 2022 (7 pgs.).
(Continued)

*Primary Examiner* — Jason L McCormack
(74) *Attorney, Agent, or Firm* — Finnegan, Henderson, Farabow, Garrett & Dunner, LLP

(57) ABSTRACT

A multi-beam electron-optical system for a charged-particle assessment tool, the system comprising: a plurality of control lenses, a plurality of objective lenses and a controller. The plurality of control lenses are configured to control a parameter of a respective sub-beam. The plurality of objective lenses are configured to project one of the plurality of charged-particle beams onto a sample. The controller controls the control lenses and the objective lenses so that the charged particles are incident on the sample with a desired landing energy, demagnification and/or beam opening angle.

20 Claims, 8 Drawing Sheets

(58) Field of Classification Search
CPC ..... H01J 2237/04756; H01J 2237/0492; H01J 2237/1205
USPC .............................. 250/306, 307, 311, 492.2
See application file for complete search history.

(56) References Cited

U.S. PATENT DOCUMENTS

| | | | | |
|---|---|---|---|---|
| 2002/0036264 | A1* | 3/2002 | Nakasuji | H01J 37/185 250/306 |
| 2006/0097197 | A1 | 5/2006 | Sakaguchi | |
| 2007/0272856 | A1 | 11/2007 | Nijkerk et al. | |
| 2009/0146074 | A1 | 6/2009 | Banzhof et al. | |
| 2009/0261267 | A1 | 10/2009 | Wieland et al. | |
| 2011/0079730 | A1 | 4/2011 | Wieland | |
| 2012/0091318 | A1 | 4/2012 | Wieland et al. | |
| 2013/0341526 | A1* | 12/2013 | Ohashi | B82Y 10/00 250/396 R |
| 2014/0014852 | A1 | 1/2014 | Wieland et al. | |
| 2017/0243717 | A1 | 8/2017 | Kruit | |
| 2018/0158642 | A1* | 6/2018 | Frosien | H01J 37/28 |
| 2020/0194214 | A1 | 6/2020 | Van Veen et al. | |

FOREIGN PATENT DOCUMENTS

| | | | |
|---|---|---|---|
| JP | 2006510184 | A | 3/2006 |
| JP | 2012504843 | A | 2/2012 |
| JP | 2013-168398 | A | 8/2013 |
| JP | 2014007013 | A | 1/2014 |
| JP | 2020102452 | A | 7/2020 |
| NL | 2002031 | C | 3/2010 |
| TW | 201614706 | A | 4/2016 |
| TW | 201923814 | A | 6/2019 |
| WO | WO 2009/141428 | A1 | 11/2009 |
| WO | WO 2012/081422 | A1 | 6/2012 |
| WO | WO 2016/036246 | A2 | 3/2016 |
| WO | WO 2016/036246 | A3 | 3/2016 |
| WO | WO 2018/099756 | A1 | 6/2018 |

OTHER PUBLICATIONS

Sheng-Yung Chen et al: "In situ beam drift detection using a two-dimensional electron-beam position monitoring system for multiple-electron-beam-direct-write lithography", Journal of Vacuum Science and Technology: Part B, AVS/AIP, Melville, New York, NY, US, vol. 29 No. 4, Jul. 1, 2011.

* cited by examiner

Fig. 6
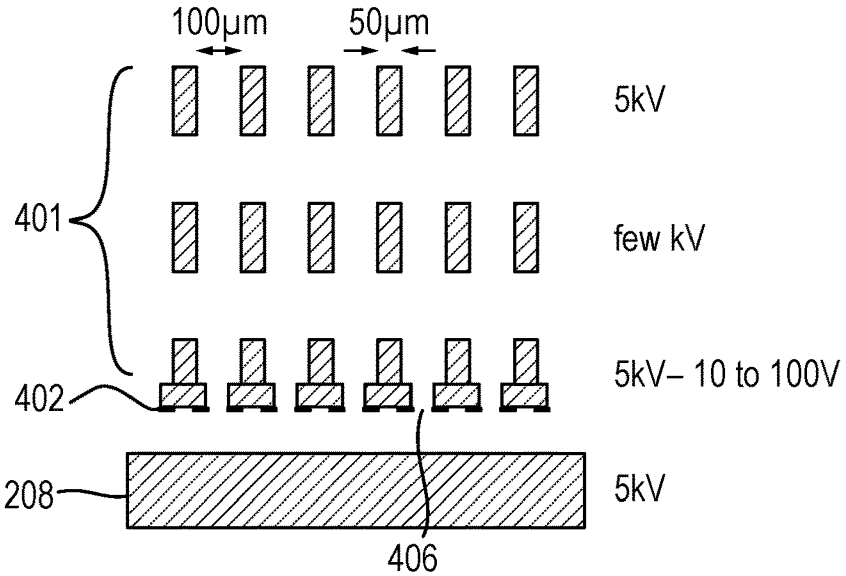
Fig. 7
Fig. 8
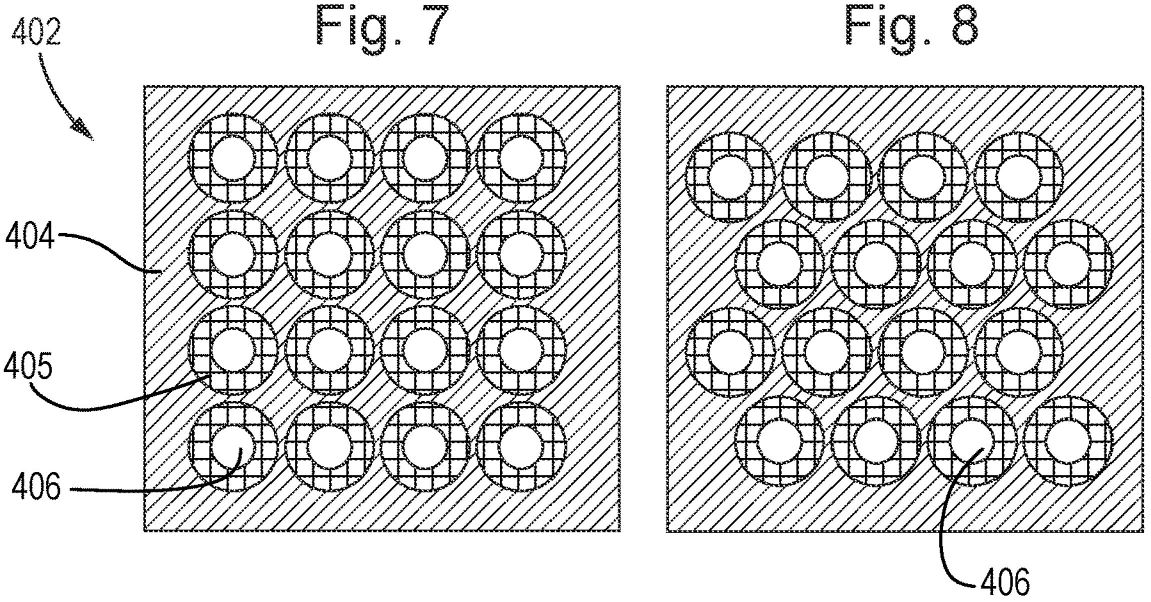
Fig. 9
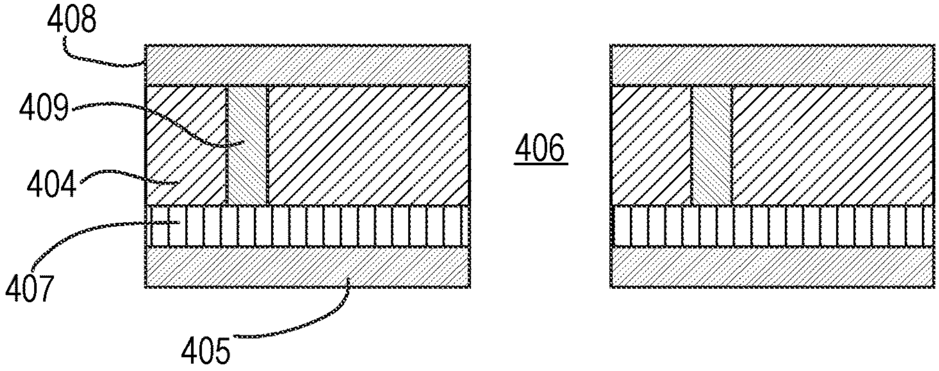

CHARGED PARTICLE ASSESSMENT TOOL, INSPECTION METHOD

CROSS-REFERENCE TO RELATED APPLICATIONS

This application claims priority of International application PCT/EP2021/075019, filed on Sep. 10, 2021, which claims priority of EP application 20196716.3, which was filed on Sep. 17, 2020, of EP application 21166205.1, which was filed on Mar. 31, 2021, and of EP application 21191725.7, which was filed on Aug. 17, 2021. These applications are incorporated herein by reference in their entireties.

FIELD

The embodiments provided herein generally relate to charged-particle assessment tools and inspection methods, and particularly to charged-particle assessment tools and inspection methods that use multiple sub-beams of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There is a general need to improve the throughput and other characteristics of charged-particle assessment tools. In particular it is desirable to be able to control the landing energy of the electrons incident on the sample in a convenient manner.

SUMMARY

It is an object of the present disclosure to provide embodiments that support improvement of throughput or other characteristics of charged-particle assessment tools.

According to some embodiments of the present disclosure, there is provided a multi-beam electron-optical system for a charged-particle assessment tool, the system comprising:

- a plurality of control lenses, each configured to control a parameter of a respective sub-beam;
- a plurality of objective lenses, each configured to project one of the plurality of charged-particle beams onto a sample; and
- a controller configured to control the control lenses and the objective lenses so that the charged particles are incident on the sample with a desired landing energy, demagnification and/or beam opening angle.

According to some embodiments of the present disclosure, there is provided a multi-beam electron-optical system for a charged-particle assessment tool, the system comprising:

- a control lens array, comprising a plurality of control electrodes and configured to control a parameter of a respective sub-beam;
- an objective lens array comprising a plurality of objective electrodes and configured to direct the plurality of charged-particle beams onto a sample; and
- a potential source system configured to apply relative potentials to the control electrodes and objective electrodes so that the charged particles are incident on the sample with a desired landing energy, demagnification and/or beam opening angle.

According to some embodiments of the present disclosure, there is provided a multi-beam electron-optical system for a charged-particle assessment tool, the system comprising:

- an objective lens array comprising objective lenses configured to focus respective sub-beams onto a sample surface; and
- a control lens array comprising control lenses configured to control a landing energy of respective sub-beams on the sample surface and/or to optimize an opening angle and/or magnification of respective sub-beams prior to operation of the objective lens array.

According to some embodiments of the present disclosure, there is provided a multi-beam electron-optical system for an inspection tool, the system comprising:

- an objective lens array configured to focus a plurality of collimated sub-beams on a sample;
- a control lens array up-beam of the objective lens array, the control lens array configured to control the beam energy of each sub-beam,
- wherein the system is configured to adjust the landing energy of the sub-beams on the sample.

According to some embodiments of the present disclosure, there is provided a multi-beam electron-optical system for a charged-particle assessment tool, the system comprising an objective lens array assembly comprising a plurality of aperture arrays, the objective lens array assembly configured to:

a) focus a plurality of sub-beams on a sample; and
b) control another parameter of the sub-beams, the parameter being at least one of: landing energy of the sub-beams on the sample surface, opening angle of respective sub-beams and/or magnification of respective sub-beams.

According to some embodiments of the present disclosure, there is provided an inspection method comprising:

- using a plurality of control lenses to control a parameter of a respective one of a plurality of sub-beams of charged particles;

using a plurality of objective lenses to project the plurality of charged-particle beams onto a sample; and controlling the control lenses and the objective lenses so that the charged particles are incident on the sample with a desired landing energy, demagnification and/or beam opening angle.

According to some embodiments of the present disclosure, there is provided a replaceable module configured to be replaceable in an electron-optical column of a charged particle inspection tool, the module comprising an objective lens array comprising a plurality of control lenses configured to control the demagnification and/or landing energy of a multi-beam.

BRIEF DESCRIPTION OF FIGURES

The above and other aspects of the present disclosure will become more apparent from the description of exemplary embodiments, taken in conjunction with the accompanying drawings.

FIG. 6 is a schematic cross-sectional view of an objective lens of an inspection apparatus according to some embodiments of the present disclosure.

FIG. 7 is bottom view of the objective lens of FIG. 8.

FIG. 8 is a bottom view of a modification of the objective lens of FIG. 6.

FIG. 9 is an enlarged schematic cross-sectional view of a detector incorporated in the objective lens of FIG. 6.

DETAILED DESCRIPTION

Figure 1:
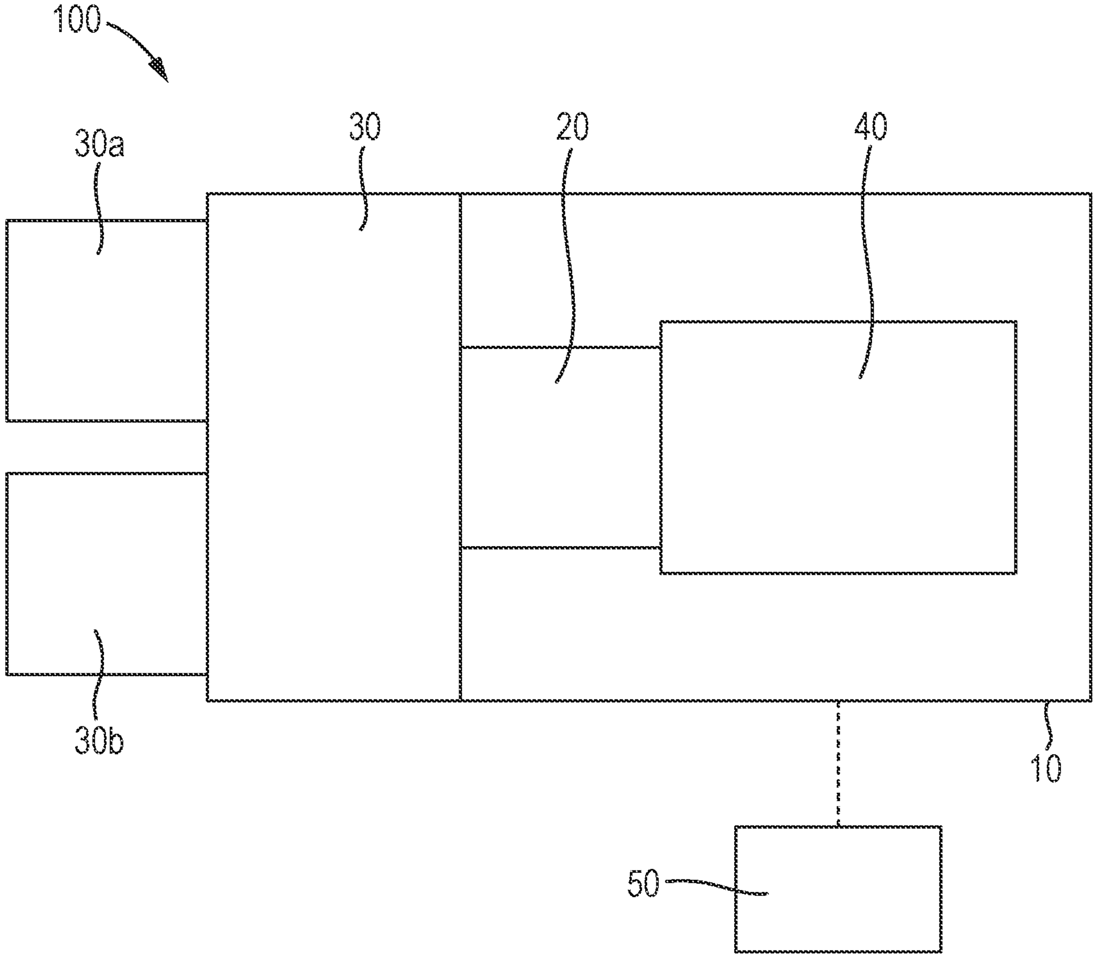
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
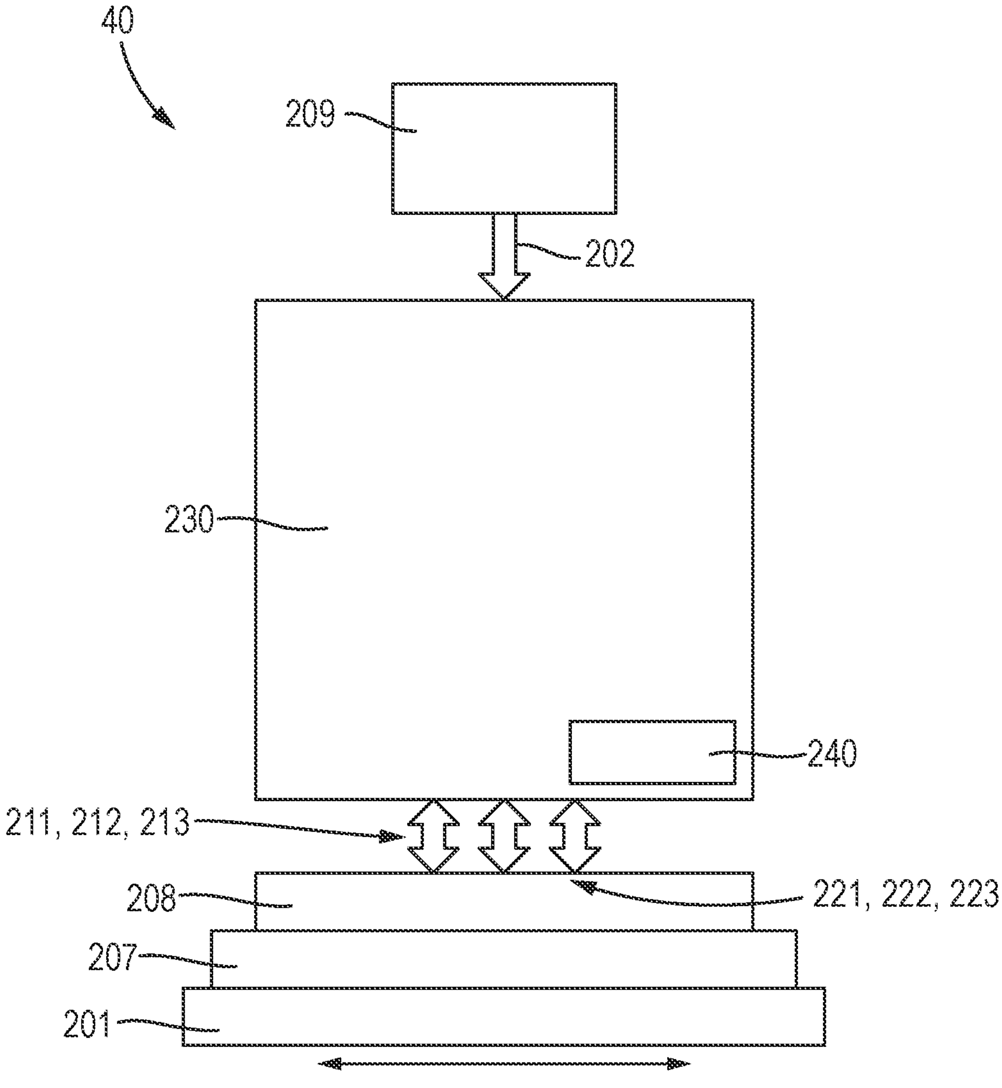
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Figure 3:
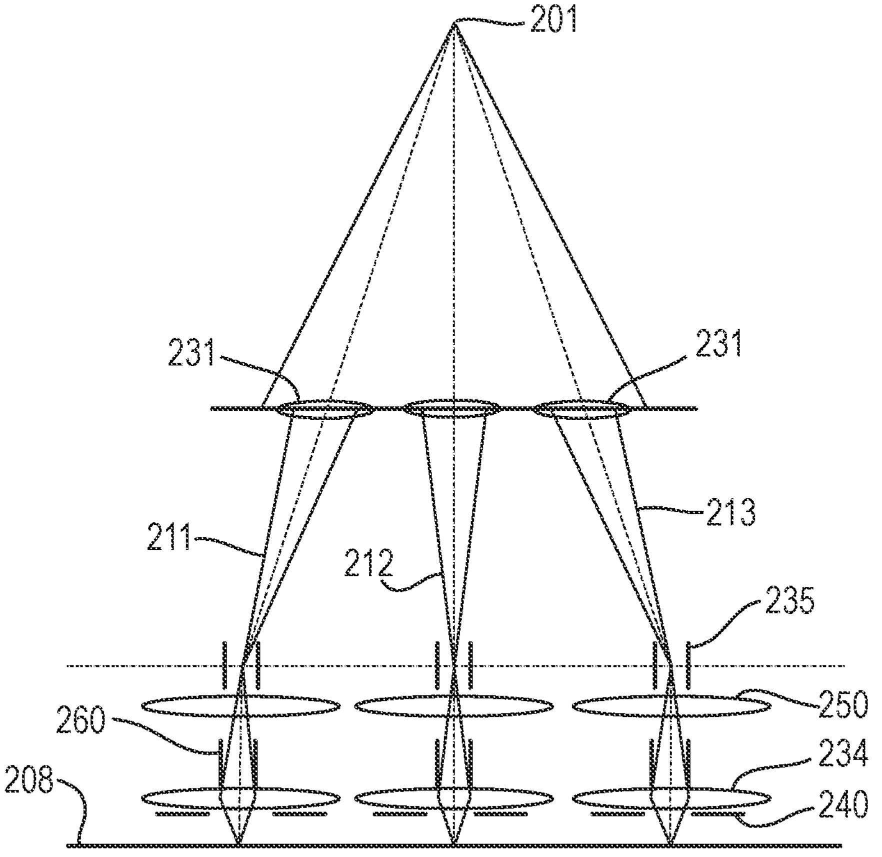
FIG. 3 is a schematic diagram of an exemplary multi-beam apparatus according to some embodiments of the present disclosure.

FIG. 3 is a schematic diagram of an assessment tool for example an electron optical column 40 of the assessment tool. Electron-optical column 40 may comprise a source 201. The electron-optical column 40 is an example of an electron-optical architecture that may comprise features such as an upper beam limiter 252, a collimator element array 271, a control lens array 250, a scan deflector array 260, an objective lens array 241, a beam shaping limiter 242 and a detector array 240; one or more of these elements that are present may be connected to one more adjacent elements with an isolating element such as a ceramic spacer. The detector array may comprise a detector element associated with a respective sub-beam of the multi-beam.

Electron source 201 directs electrodes toward an array of condenser lenses 231 forming part of projection system 230. The electron source is desirably a high brightness thermal field emitter with a good compromise between brightness and total emission current. There may be many tens, many hundreds or many thousands of condenser lenses 231. Condenser lenses of array 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

The condenser lens array 231 may have two or more plate electrodes each with an array of apertures that are aligned. Each plate electrode array is mechanically connected to, and electrically isolated from, an adjacent plate electrode array by an isolating element, such as a spacer which may comprise ceramic or glass. The condenser lens array may be connected and/or spaced apart from an adjacent electron-optical element, preferably an electrostatic electron-optical element, by an isolating element such as a spacer as described elsewhere herein.

The condenser lenses are separated from a module containing the objective lenses (such as an objective lens array assembly as discussed below). In a case where the potential applied on a bottom surface of the condenser lenses is different than the potential applied on the top surface of the module containing the objective lenses an isolating spacer is used to space apart the condenser lenses and the module containing the objective lenses. In a case where the potential is equal then a conductive element can be used to space apart the condenser lenses and the module containing the objective lenses.

Each condenser lens in the array directs electrons into a respective sub-beam 211, 212, 213 which is focused at a respective intermediate focus 233. Deflectors 235 are provided at the intermediate focuses 233. Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators.

Below (i.e. down beam or further from source 201) deflectors 235 there is a control lens array 250 comprising a control lens 251 for each sub-beam 211, 21, 213. Control lens array 250 may comprise two or more, e.g. three plate, electrode arrays connected to respective potential sources. Each plate electrode array is mechanically connected to, and electrically separated from, an adjacent plate electrode array by an isolating element, such as a spacer which may comprise ceramic or glass. A function of control lens array 250 is optimize the beam opening angle with respect to the demagnification of the beam and/or to control the beam energy delivered to the objective lenses 234, each of which directs a respective sub-beam 211, 212, 213 onto the sample 208.

Optionally an array of scan deflectors 260 is provided between the control lens array 250 and the array of objective lenses 234. The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

An electron detection device 240 is provided between the objective lenses 234 and the sample 208 to detect secondary and/or backscattered electrons emitted from the sample 208. An exemplary construction of the electron detection system is described below. The detector and objective lens may be part of the same structure. The detector may be connected to the lens by an isolating element or directly to an electrode of the objective lens.

Figure 4:
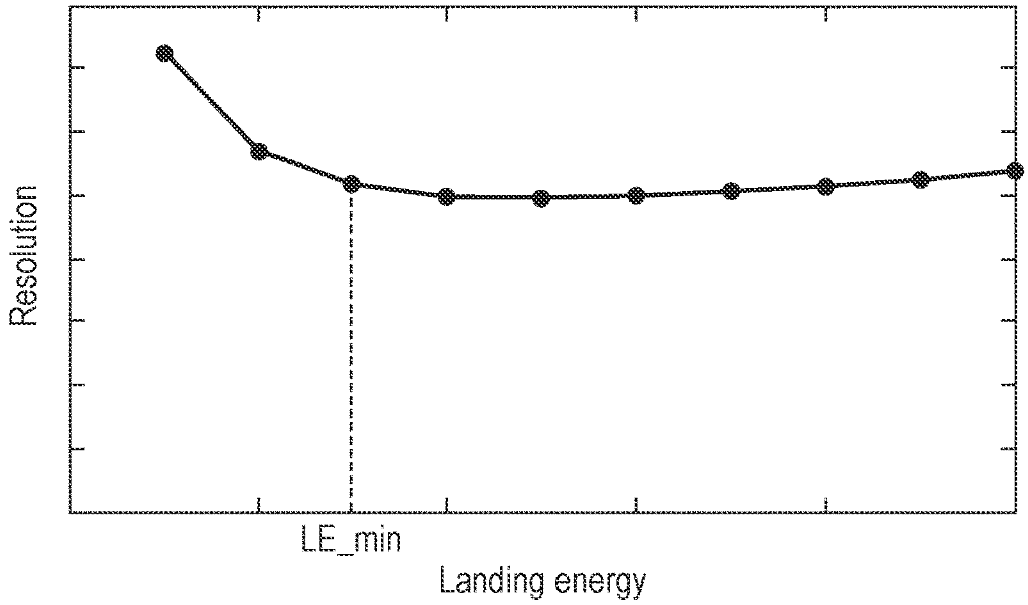
FIG. 4 is a graph of landing energy vs. resolution of an exemplary arrangement.

The system of FIG. 3 is configured to control the landing energy of the electrons on the sample by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. In some embodiments, the landing energy can be controlled to a desired value in a predetermined range, e.g. from 1000 eV to 5000 eV. FIG. 4 is a graph depicting resolution as a function of landing energy, assuming the beam opening angle/demagnification is re-optimized for changing landing energy. As can be seen, the resolution of the assessment tool can be kept substantially constant with change in landing energy down to a minimum value LE_min. Resolution deteriorates below LE_min because it is necessary to reduce the lens strength of, and electric fields within, the objective lens in order to maintain a minimum spacing between objective lens and/or detector and the sample. Exchangeable modules, as discussed further below, may also be employed to vary or control the landing energy.

Figure 5:
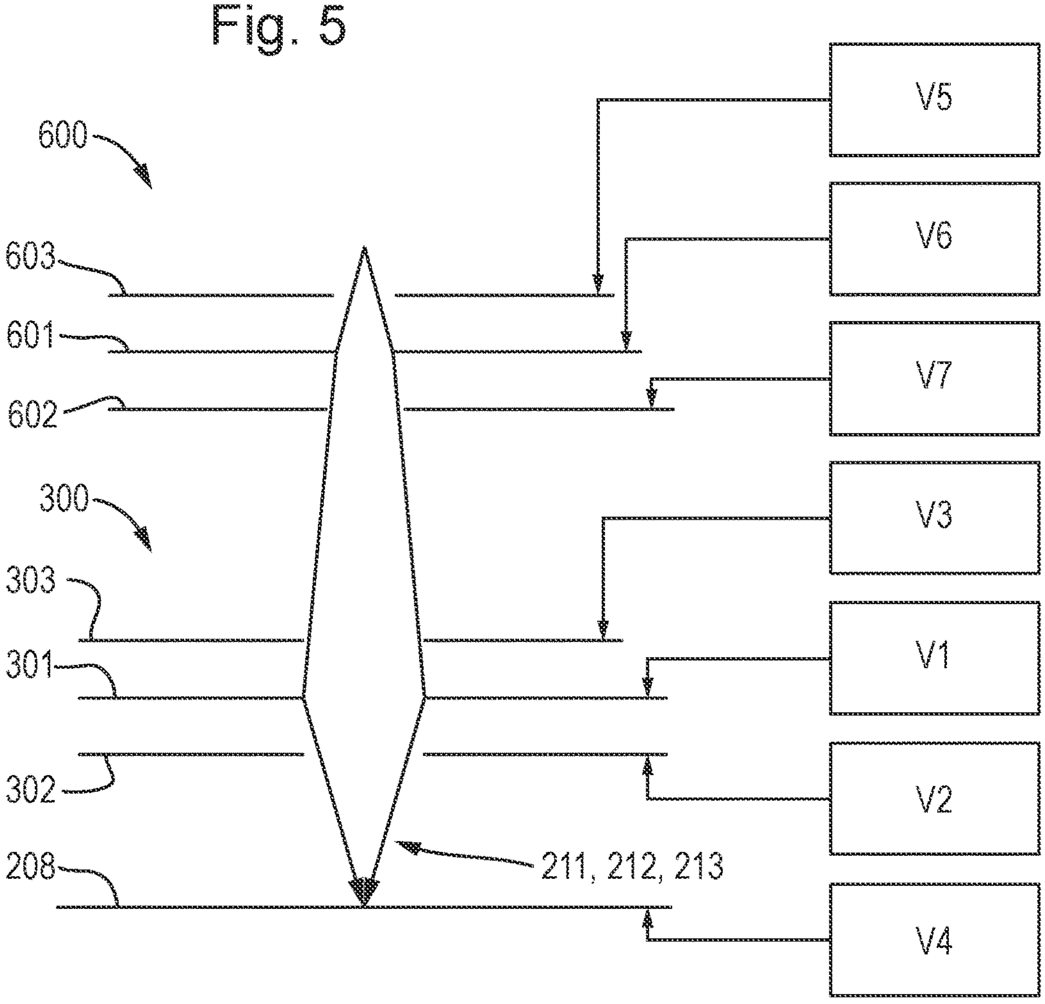
FIG. 5 is an enlarged diagram of an objective lens according to some embodiments of the present disclosure.

Desirably, the landing energy is primarily varied by controlling the energy of the electrons exiting the control lens. The potential differences within the objective lenses are preferably kept constant during this variation so that the electric field within the objective lens remains as high as possible. Such a high electric field within the object lens may be referred to and may be set at a pre-determined electric field. The potentials applied to the control lens in addition may be used to optimize the beam opening angle and demagnification. The control lens can function to change the demagnification in view of changes in landing energy. Desirably, each control lens comprises three electrodes so as to provide two independent control variables as further discussed below. For example, one of the electrodes can be used to control magnification while a different electrode can be used to independently control landing energy. Alternatively each control lens may have only two electrodes. When there are only two electrodes, in contrast, one of the electrodes may need to control both magnification and landing energy FIG. 5 is an enlarged schematic view of one objective lens 300 of the array of objective lenses and one control lens 600 of the control lens array 250. Objective lens 300 can be configured to demagnify the electron beam by a factor greater than 10, desirably in the range of 50 to 100 or more. The objective lens comprises a middle or first electrode 301, a lower or second electrode 302 and an upper or third electrode 303. Voltage sources V1, V2, V3 are configured to apply potentials to the first second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g. in the range of from 50 V to 200 V more positive than the sample. Alternatively the second potential can be in the range of from about +500 V to about +1,500 V relative to the sample. A higher potential is useful if the detector 240 is higher in the optical column than the lowest electrode. The first and/or second potentials can be varied per aperture or group of apertures to effect focus corrections.

Desirably, in some embodiments, the third electrode is omitted. An objective lens having only two electrodes can have lower aberration than an objective lens having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam.

As mentioned above, it is desirable to use the control lens to determine the landing energy. However, it is possible to use in addition the objective lens 300 to control the landing energy. In such a case, the potential difference over the objective lens is changed when a different landing energy is selected. One example of a situation where it is desirable to partly change the landing energy by changing the potential difference over the objective lens is to prevent the focus of the sub-beams getting too close to the objective lens. In such a situation there is a risk of the objective lens electrode of having to too thin to be manufacturable. The same may be said about a detector (e.g. as a detector array) at this location. This situation can for example occur if the landing energy is lowered. This is because the focal length of the objective lens roughly scales with the landing energy chosen. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further using the objective lens to control the landing energy could mean that the objective lens would be operating away from its optimal field strength. That is unless mechanical parameters of the objective lens (such as the spacing between its electrodes) could be adjusted for example by exchanging the objective lens.

In the arrangement depicted, control lens 600 comprises three electrodes 601-603 connected to potential sources V5 to V7. Electrodes 601-603 may be spaced a few millimeters (e.g. 3 mm) apart. The spacing between the control lens and the objective lens (i.e. the gap between lower electrode 602 and the upper electrode of the objective lens) can be selected form a wide range, e.g. from 2 mm to 200 mm or more. A small separation makes alignment easier whereas a larger separation allows a weaker lens to be used, reducing aberrations. Desirably, the potential V5 of the uppermost electrode 603 of the control lens 600 is maintained the same as the potential of the next electron-optic element up-beam of the control lens (e.g. deflectors 235). The potential V7 applied to the lower electrode 602 can be varied to determine the beam energy. The potential V6 applied to the middle electrode 601 can be varied to determine the lens strength of the control lens 600 and hence control the opening angle and demagnification of the beam. Desirably, the lower electrode 602 of the control lens and the uppermost electrode of the objective lens and the sample has substantially the same potential. In one design the upper electrode of the objective lens V3 is omitted. In this case desirably the lower electrode 602 of the control lens and electrode 301 of the objective lens have substantially the same potential. It should be noted that even if the landing energy does not need to be changed, or is changed by other means, the control lens can be used to control the beam opening angle. The position of the focus of a sub-beam is determined by the combination of the actions of the respective control lens and the respective objective lens.

In an example, to obtain landing energies in the range of 1.5 kV to 2.5 kV, potentials V1, V2, V4, V5, V6 and V7 can be set as indicated in Table 1 below. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

TABLE 1

| Landing Energy | 1.5 keV | 2.5 keV | 3.5 keV |
|---|---|---|---|
| V1 | 29 keV | 30 keV | 31 keV |
| V2 | 1.55 keV | 2.55 keV | 3.55 keV |
| V3 (or omitted) | 29 keV | 30 keV | 31 keV |
| V4 | 1.5 keV | 2.5 keV | 3.5 keV |
| V5 | 30 keV | 30 keV | 30 keV |
| V6 | 19.3 keV | 20.1 keV | 20.9 keV |
| V7 | 29 keV | 30 keV | 31 keV |

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields. It is also noted that the potential difference applied to adjoining electrodes of the objective lens array are largest of the potential differences applied to adjoining electrodes in the objective lens arrangement. In avoiding the reduction of the electric field in the objective lens, the electric field in the objective lens may be predetermined. The electric field in the objective lens may be optimized for a desired performance of the objective lens, for example, as providing the largest potential difference between adjacent electrodes along the beam path, for example, of any electrode in the objective lens array assembly. Variation around such a large potential difference may be a source of errors and aberrations. Substantially maintaining the potential difference between electrodes of the objective lens array and varying the potential of other electrodes in the objective lens array arrangement, helps to ensure that the operation of the objective lens is maintained, for example in having a large field for example for a short stable focal length. Variation of the function of the objective lens arrangement is achieved through variation of the potential differences applied to other electrodes of the arrangement, reducing the risk of inducing large aberrations.

Figure 10:
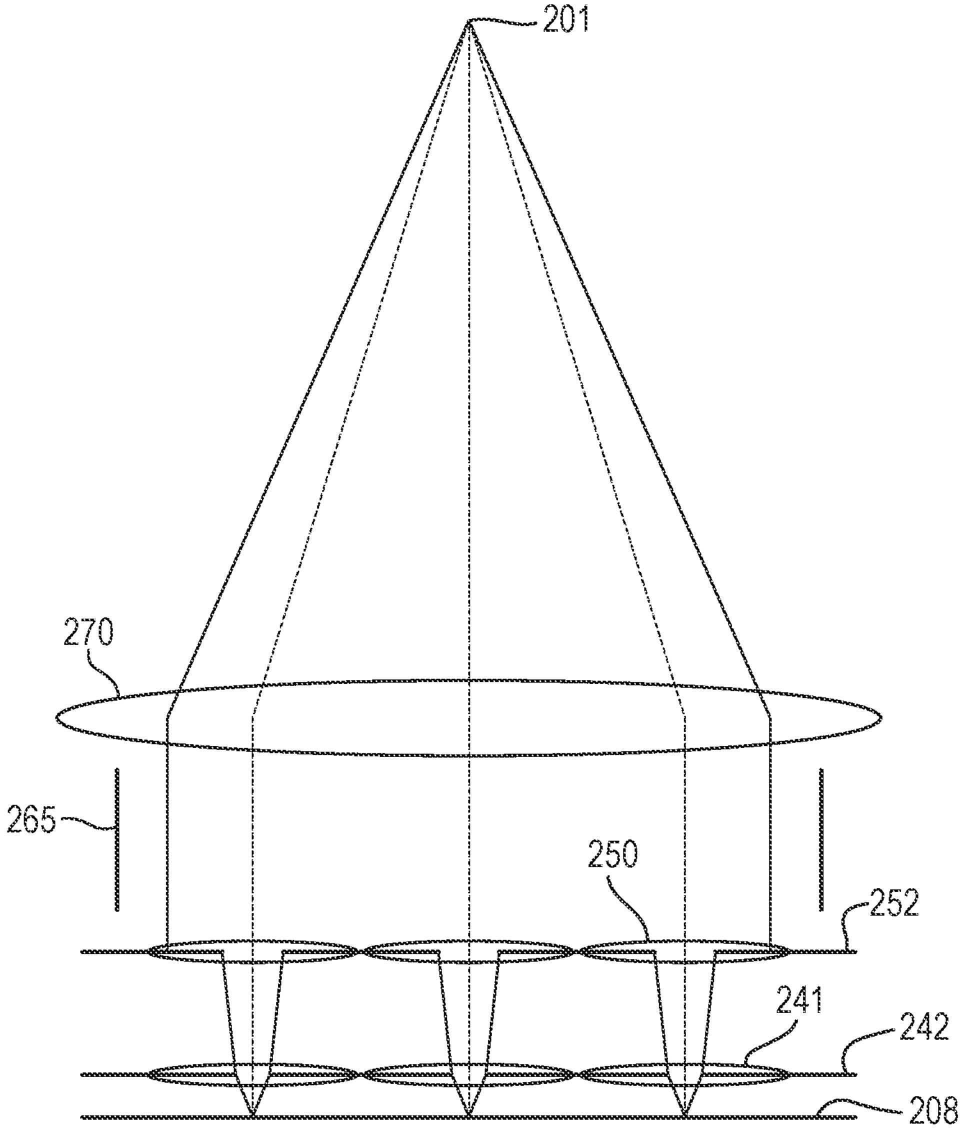
FIG. 10 is a schematic diagram of an exemplary electron-optical system comprising a macro collimator and macro scan deflector.
Figure 11:
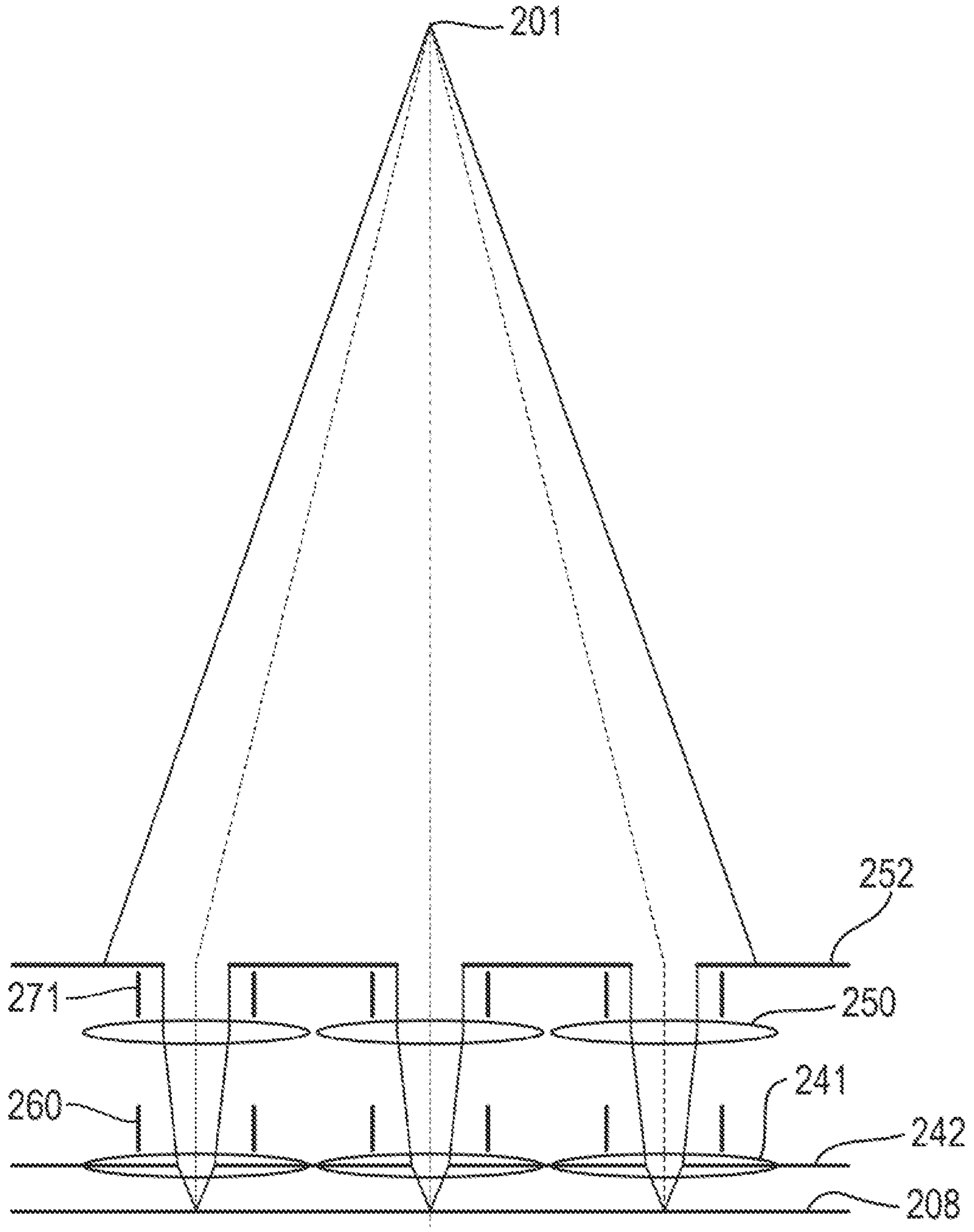
FIG. 11 is a schematic diagram of an exemplary electron-optical system comprising a collimator element array and a scan-deflector array.

When the control lens, rather than the condenser lens of the example of FIG. 3, is used for opening angle/magnification correction of the electron beam, the collimator remains at the intermediate focus so there is no need for astigmatism correction of the collimator. (It should be noted that in such an arrangement adjustment of magnification results in similar adjustment of the opening angle because the beam current remains consistent along the beam path). In addition, the landing energy can be varied over a wide range of energies whilst maintaining an optimum field strength in the objective lens. Such an optimal field strength may be referred to as a pre-determined field strength. During operation the field strength may be pre-determined as the optimal field strength. This minimizes aberrations of the objective lens. The strength of the condenser lens (if used) is also maintained constant, avoiding any introduction of additional aberrations due to the collimator not being at the intermediate focal plane or to changes in the path of the electron through the condenser lens. Further, when the control lens of an example featuring a beam-shaping limiter such as shown in FIGS. 10 and 11 (which does not have a condenser lens), is used the opening angle/magnification may additionally be controlled as well as the landing energy.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane). The sub-beams have a smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses of condenser lens array 231 (e.g. with each such aberration corrector being integrated with, or directly adjacent to, one or more of the condenser lenses 231). This is desirable because at or near the condenser lenses of condenser lens array 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference. The condenser lenses and correctors may be part of the same structure. For example they may be connected to each other, for example with an electrically isolating element.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212,214 over the sample 208. In some embodiments, the scanning deflectors described in US 2010/0276606, which document is hereby incorporated by reference in its entirety, may be used.

In some embodiments, the objective lens referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is a two electrode decelerating lens.

In some embodiments, the detector 240 of the objective lens array assembly comprises a detector array down-beam of at least one electrode of the objective lens array 241. The detector array may be a plurality of detector elements. Thus the detector may be within the objective lens array assembly. In some embodiments, at least a portion of the detector (e.g. the detector module) is adjacent to and/or integrated with the objective lens array 240. For example, the detector array may be implemented by integrating a CMOS chip detector into a bottom electrode of the objective lens array. Integration of a detector array into the objective lens array replaces a secondary column. The CMOS chip is preferably orientated to face the sample (because of the small distance (e.g. 100 μm) between wafer and bottom of the electron-optical system). There is a small distance between the detector and the sample, even at any position the detector may have in the objective lens array. At such a distance the sample may be within a range of the detector. Such a small distance, or optimum distance, between the sample and detector may be desirable for example to avoid cross-talk between detector elements; or the detector signal may be too weak if the distance is too large. The optimum distance or range of the detector maintains a minimum spacing between the detector and the sample (which may relate or be similar to the spacing between also the objective lens array and the sample). However, the small distance is not too small to prevent risk of damage to the sample, its support or a component of the objective lens array assembly such as the detector. In some embodiments, electrodes to capture the secondary electron signals are formed in the top metal layer of the CMOS device (for example the surface of the detector facing the sample). The electrodes can be formed in other layers. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

In order to maximize the detection efficiency it is desirable to make the electrode surface as large as possible, so that substantially all the area of the objective lens array (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single electrode surrounds each aperture. In some embodiments, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified by a Trans Impedance Amplifier.

An example of a detector integrated into an objective lens array is shown in FIG. 6 which illustrates a portion of a multibeam objective lens 401 in schematic cross section. In this example, the detector comprises a detector module 402 comprising a plurality of detector elements 405 (e.g. sensor elements such as capture electrodes). Thus the detector may be a detector array or an array of detector elements. In this example, the detector array 402 is provided on an output side of the objective lens array. The output side is the output side of the objective lens 401. FIG. 7 is a bottom view of detector module 402 which comprises a substrate 404 on which are provided a plurality of capture electrodes 405 each surrounding a beam aperture 406. The beam apertures 406 may be formed by etching through substrate 404. In the arrangement shown in FIG. 7, the beam apertures 406 are shown in a rectangular array. The beam apertures 406 can also be differently arranged, e.g. in a hexagonal close packed array as depicted in FIG. 8.

FIG. 9 depicts at a larger scale a part of the detector module 402 in cross section. Detector elements, for example capture electrodes 405, form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallization layer.

A wiring layer 408 is provided on the backside of, or within, substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

The integrated detector array described above is particularly advantageous when used with a tool having tunable landing energy as secondary electron capture can be optimized for a range of landing energies. A detector array can also be integrated into other electrode arrays, not only the lowest electrode array. Further details and alternative arrangements of a detector module integrated into an objective lens can be found in EP Application Number 20184160.8, which document is hereby incorporated by reference.

Embodiments of the present disclosure provide an objective lens array assembly. The objective lens array assembly may be incorporated into an electron-optical system of a charged-particle assessment tool. The charged-particle assessment tool may be configured to focus a multi-beam on a sample.

FIG. 10 is a schematic diagram of an exemplary electron-optical system having the objective lens array assembly. The objective lens array assembly comprises an objective lens array 241. The objective lens array 241 comprises a plurality of objective lenses. Each objective lens comprises at least two electrodes (e.g. two or three electrodes) connected to respective potential sources. The objective lens array 241 may comprise two or more (e.g. three) plate electrode arrays connected to respective potential sources. Each objective lens formed by the plate electrode arrays may be a micro-lens operating on a different sub-beam or group of sub-beams in the multi-beam. Each plate defines a plurality of apertures (which may also be referred to as holes). The position of each aperture in a plate corresponds to the position of a corresponding aperture (or corresponding hole) in the other plate (or plates). The corresponding apertures define the objective lenses and each set of corresponding holes therefore operates in use on the same sub-beam or group of sub-beams in the multi-beam. Each objective lens projects a respective sub-beam of the multi-beam onto a sample 208.

For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. As described above, lens arrays may instead comprise multiple plates with apertures.

The objective lens array assembly further comprises a control lens array 250. (Thus the objective lens array assembly may comprise the control lens array 250 and the objective lens array 241). The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The control lens array 250 is associated with the objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams. (e.g. apply a focusing action to the sub-beams prior to the sub-beams reaching the objective lens array 241). Thus, if the only lenses in the objective lens array assembly are the control lens array 250 and the objective lens array 241, then the combined focus of the control lenses and objective lenses may be controlled to be on the sample. The pre-focusing may reduce divergence of the sub-beams or increase a rate of convergence of the sub-beams. The control lens array has a pre-focus length. Together with the objective lens array the control lens array operate together to provide a combined focal length. Combined operation without an intermediate focus may reduce the risk of aberrations The control lens may be controlled so as to focus the respective sub-beams on the sample for example maintaining a minimum spacing between the sample and the objective lens array and/or sample. Thus control of the control lenses and the respective objective lenses may determine the focus position (e.g. each focus) of each sub-beam, preferably on the sample. Thus a combined action on the respective objective lenses and of the respective control lenses determines the focus position of the respective sub-beams on the sample. Put differently, a combined lens effect on the respective sub-beams by the respective objective lenses and the respective control lenses leads to a focus on the sample. This may be expressed as: a combined lens effect of the respective sub-beams by the respective objective lenses and the respective control lenses leads to a focus on the sample. Said differently: the respective objective lenses and the respective control lenses together focus the respective sub-beams on the sample. Alternatively or additionally the controller is configured to control the objective lenses to focus the respective sub-beams on the sample and to control the control lenses to control the parameter of a pre-focus of the respective sub-beams so that the pre-focus of the respective sub-beams is prior to the focus of the respective sub-beams by the objective lens on the sample The control lens array 250 can be considered as providing electrodes additional to the electrodes of the objective lens array 241. (Noting this applies to the control lens of the example of FIG. 10 as much as the example of FIGS. 3 and 11) The additional electrodes of the control lens array 250 allow further degrees of freedom for controlling the electron-optical parameters of the sub-beams. In some embodiments, the control lens array 250 may be considered to be additional electrodes of the objective lens array 241 enabling additional functionality of the respective objective lenses of the objective lens array 241. In an arrangement such electrodes may be considered part of the objective lens array providing additional functionality to the objective lenses of the objective lens array 241. In such an arrangement, the control lens is considered to be part of the corresponding objective lens, even to the extent that the control lens is only referred to as being a part of the objective lens.

In some embodiments, an electron-optical system comprising the objective lens array assembly is configured to control the objective lens assembly (e.g. by controlling potentials applied to electrodes of the control lens array 250) so that a focal length of the control lenses is larger than a separation between the control lens array 250 and the objective lens array 241. The control lens array 250 and objective lens array 241 may thus be positioned relatively close together, with a focusing action from the control lens array 250 that is too weak to form an intermediate focus between the control lens array 250 and objective lens array 241. The focus positions of the respective sub-beams by the control lens array may be down-beam of the objective lens array. In other embodiments, the objective lens array assembly may be configured to form an intermediate focus between the control lens array 250 and the objective lens array 241. The sub-beams may have an intermediate focus between the control lens array and the objective lens array.

In some embodiments, the control lens array is an exchangeable module, either on its own or in combination with other elements such as the objective lens array and/or detector array. The exchangeable module may be field replaceable, i.e. the module can be swapped for a new module by a field engineer. In some embodiments, multiple exchangeable modules are contained within the tool and can be swapped between operable and non-operable positions without opening the tool.

In some embodiments, the exchangeable module comprises an electron-optical component which is on a stage permitting actuation for positioning of the component. In some embodiments, the exchangeable module comprises a stage. In an arrangement the stage and the exchangeable module may be an integral part of the electron-optical tool 40. In an arrangement the exchangeable module is limited to the stage and the electron-optical device it supports. In an arrangement the stage is removable. In an alternative design the exchangeable module comprising the stage is removable. The part of the electron-optical tool 40 for the exchangeable module is isolatable, that is the part of the electron-optical tool 40 is defined by a valve up-beam and a valve down-beam of the exchangeable module. The valves can be operated to isolate the environment between the valves from the vacuum up-beam and down-beam of the valves respectively enabling the exchangeable module to be removed from the electron-optical tool 40 whilst maintaining the vacuum up-beam and down-beam of the part of the column associated with the exchangeable module. In some embodiments, the exchangeable module comprises a stage. The stage is configured to support an electron-optical device relative to the beam path. In some embodiments, the module comprises 405 one or more actuators. The actuators are associated with the stage. The actuators are configured to move the electron-optical device relative to the beam path. Such actuation may be used to align the electron-optical device and the beam path with respect to each other.

In some embodiments, the exchangeable module is a MEMS module. In some embodiments, the exchangeable module is configured to be replaceable within the electron-optical tool 40. In some embodiments, the exchangeable module is configured to be field replaceable. Field replaceable is intended to mean that the module may be removed and replaced with the same or different module while maintaining the vacuum in which the electron-optical tool 40 is located. Only a section of the column is vented corresponding to the module; the section is vented for the module to be removed and returned or replaced. On replacing a module within the column, the section of the column may be vented for complete removal and replacement not only from the column but the apparatus or tool. In some embodiments, the section may be vented so that module within the vented section of the column may be replaced with a module stored elsewhere in the tool or apparatus. Such a stored module may be stored in a compartment of one or more modules held under a vacuum. The vacuum of the compartment for storage of the module may be stored at less deep vacuum than the column. In some embodiments, the compartment may be at the same under-pressure as the column, so that the venting of the section of the column in which the module is located is not required.

The control lens array may be in the same module as an objective lens array 241, i.e. forming an objective lens array assembly or objective lens arrangement, or it may be in a separate module An electric power source may be provided to apply respective potentials to electrodes of the control lenses of the control lens array 250 and the objective lenses of the objective lens array 241.

The provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. The control lens array 250 may be used to optimize a beam opening angle with respect to the demagnification of the beam and/or to control the beam energy delivered to the objective lens array 241. The control lens may comprise 2 or 3 or more electrodes. If there are two electrodes, then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved with having an excessively negative impact on the number of objective lenses and without excessively deteriorating aberrations of the objective lenses (e.g. without increasing the strength of the objective lenses). Use of the control lens array enables the objective lens array to operate at its optimal electric field strength. Thus such operation of the control lens may enable the field strength of the objective lens array to be predetermined. Note that it is intended that the reference to demagnification and opening angle is intended to refer to variation of the same parameter. In an ideal arrangement the product of a range of demagnification and the corresponding opening angles is constant. However, the opening angle may be influenced by the use of an aperture In the example of FIG. 10, the electron-optical system comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In the example of FIG. 10 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 256 comprises a macroscopic multi-pole deflector, for example with 8 poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

Any of the objective lens array assemblies described herein may further comprise a detector (e.g. comprising a detector module 402). The detector may comprise a detector array for example of detector elements. The detector detects charged particles emitted from the sample 208. The detected charged particles may include any of the charged particles detected by an SEM, including secondary and/or backscattered electrons emitted from the sample 208. An exemplary construction of a detector module is described above with reference to FIGS. 6 to 9. The detector, i.e. the detector array, of the detector module may be positioned within a specified range of the sample for example along the beam path. The distance between the detector and the sample maybe small, even for any position the detector may have in the objective lens array or even the objective lens array assembly. Such a small distance, which is an optimum distance or a range of the detector, between the sample and detector may be desirable for example to avoid cross-talk between detector elements, or the detector signal may be too weak if the distance from the sample to the detector is too large. The optimum distance or range of the detector maintains a minimum spacing between the detector and the sample (which may also the correspond to the minimum spacing between the objective lens array and the sample). However, the small distance is not too small to prevent, if not avoid, the risk of damage to the sample, its support, i.e. sample holder, or a component of the objective lens array assembly such as the detector.

FIG. 11 depicts a variation on the example of FIG. 10 in which the objective lens array assembly comprises a scan-deflector array 260. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect rays in the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). In some embodiments, the scanning deflectors described in EP2425444, which document is hereby incorporated by reference in its entirety specifically in relation to scan deflectors, may be used to implement the scan-deflector array 260. The scan-deflector array 260 is positioned between the objective lens array 241 and the control lens array 250. In the example shown, the scan-deflector array 260 is provided instead of the macro scan deflector 265. A scan-deflector array 260 (e.g. formed using MEMS manufacturing techniques as mentioned above) may be more spatially compact than a macro scan deflector 265.

In other embodiments both the macro scan deflector 265 and the scan-deflector array 260 are provided. In such an arrangement, the scanning of the sub-beams over the sample surface may be achieved by controlling the macro scan deflector 265 and the scan-deflector array 260 together, preferably in synchronization.

The provision of a scan-deflector array 260 instead of a macro scan deflector 265 can reduce aberrations from the control lenses. This is because the scanning action of the macro scan deflector 265 causes a corresponding movement of beams over a beam shaping limiter (also referred to as a lower beam limiter) defining an array of beam-limiting apertures down-beam of at least one electrode of the control lenses, which increases a contribution to aberration from the control lenses. When a scan-deflector array 260 is used instead the beams are moved by a much smaller amount over the beam shaping limiter. This is because the distance from the scan-deflector array 260 to the beam shaping limiter is much shorter. Because of this it is preferable to position the scan-deflector array 260 as close as possible to the objective lens array 241 (e.g. such that the scan-deflector array 260 is directly adjacent to the objective lens array 241 as depicted in FIG. 11. The smaller movement over the beam shaping limiter results in a smaller part of each control lens being used. The control lenses thus have a smaller aberration contribution. To minimize, or at least reduce, the aberrations contributed by the control lenses the beam shaping limiter is used to shape beams down beam from at least one electrode of the control lenses. This differs architecturally from conventional systems in which a beam shaping limiter is provided only as an aperture array that is part of or associated with a first manipulator array in the beam path and commonly generates the multi-beams from a single beam from a source.

In some embodiments, as exemplified in FIG. 10, the control lens array 250 is the first deflecting or lensing electron-optical array element in the beam path down-beam of the source 201.

In the example of FIG. 11, a collimator element array 271 is provided instead of a macro collimator 270. Although not shown, it is also possible to apply this variation to the example of FIG. 3, to provide an example having a macro scan deflector and a collimator element array. Each collimator element collimates a respective sub-beam. The collimator element array 271 (e.g. formed using MEMS manufacturing techniques) may be more spatially compact than a macro collimator 270. Providing the collimator element array 271 and the scan-deflector array 260 together may therefore provide space saving. This space saving is desirable where a plurality of the electron-optical systems comprising the objective lens array assembly are provided in an electron-optical system array. In such an example there may be no macro condenser lens or a condenser lens array. In this scenario the control lens therefore provides the possibility to optimize the beam opening angle and magnification for changes in landing energy. Note that the beam shaping limiter is downbeam of the control lens array. The apertures in the beam shaping limiter adjust the beam current along the beam path so that control of the magnification by the control lens operates differently on the opening angle. That is the apertures in the beam shaping limiter break the direct correspondence between variations in the magnification and opening angle.

In some embodiments, as exemplified in FIG. 11, the collimator element array 271 is the first deflecting or focusing electron-optical array element in the beam path down-beam of the source 201.

Avoiding any deflecting or lensing electron-optical array elements (e.g. lens arrays or deflector arrays) up-beam of the control lens array 250 or up-beam of the collimator element array 271 reduced requirements for electron-optics up-beam of the objective lenses, and for correctors to correct for imperfections in such optics. For example, some alternative arrangements seek to maximize source current utilization by providing a condenser lens array in addition to an objective lens array. The provision of a condenser lens array and an objective lens array in this manner results in stringent requirements on position of the virtual source position uniformity over the source opening angle or requires corrective optics per sub-beam in order to make sure each sub-beam passes through the center of its corresponding objective lens down-beam. Architectures such as those of FIGS. 10 and 11 allow the beam path from the first deflecting or lensing electron-optical array element to a beam shaping limiter to be reduced to less than about 10 mm, preferably to less than about 5 mm, preferably to less than about 2 mm. Reducing the beam path reduces or removes the stringent requirements on virtual source position over the source opening angle.

In some embodiments, an electron-optical system array is provided. The array may comprise a plurality of any of the electron-optical systems described herein. Each of the electron-optical systems focuses respective multi-beams simultaneously onto different regions of the same sample. Each electron-optical system may form sub-beams from a beam of charged particles from a different respective source 201. Each respective source 201 may be one source in a plurality of sources 201. At least a subset of the plurality of sources 201 may be provided as a source array. The source array may comprise a plurality of sources 201 provided on a common substrate. The focusing of plural multi-beams simultaneously onto different regions of the same sample allows an increased area of the sample 208 to be processed (e.g. assessed) simultaneously. The electron-optical systems in the array may be arranged adjacent to each other so as to project the respective multi-beams onto adjacent regions of the sample 208. Any number of electron-optical systems may be used in the array. Preferably, the number of electron-optical systems is in the range of from 9 to 200. In some embodiments, the electron-optical systems are arranged in a rectangular array or in a hexagonal array. In other embodiments, the electron-optical systems are provided in an irregular array or in a regular array having a geometry other than rectangular or hexagonal. Each electron-optical system in the array may be configured in any of the ways described herein when referring to a single electron-optical system. As mentioned above, the scan-deflector array 260 and collimator element array 271 are particularly well suited to incorporation into an electron-optical system array because of their spatial compactness, which facilitates positioning of the electron-optical systems close to each other.

Figure 12:
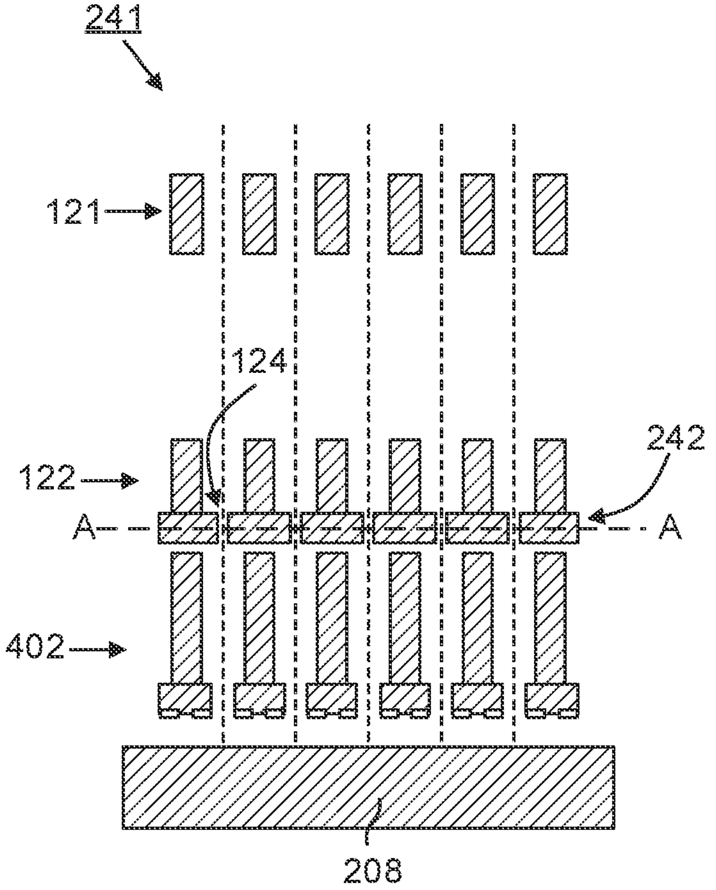
FIG. 12 is a schematic side sectional view of portions of electrodes forming objective lenses with a final beam-limiting aperture array.
Figure 13:
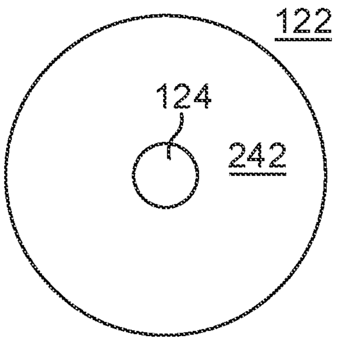
FIG. 13 is a schematic magnified top sectional view relative to plane A-A in FIG. 12 showing an aperture in the final beam-limiting aperture array.

In some embodiments, as exemplified in FIGS. 12 and 13, the objective lens array assembly further comprises a beam shaping limiter 242. The beam shaping limiter 242 defines an array of beam-limiting apertures 124. The beam shaping limiter 242 may be referred to as a beam shaping-limiting aperture array or final beam-limiting aperture array. The beam shaping limiter 242 may comprise a plate (which may be a plate-like body) having a plurality of apertures. The beam shaping limiter 242 is down-beam from at least one electrode (optionally from all electrodes) of the control lens array 250. In some embodiments, the beam shaping limiter 242 is down-beam from at least one electrode (optionally from all electrodes) of the objective lens array 241. The plate of the beam limiter 242 may be connected to an adjacent plate electrode array of the objective lens by an isolating element, such as a spacer which may comprise ceramic or glass.

In an arrangement, the beam shaping limiter 242 is structurally integrated with an electrode 302 of the objective lens array 241. That is, the plate of the beam shaping limiter 242 is connected directly to the adjacent plate electrode array of the objective lens array 241. Desirably, the beam shaping limiter 242 is positioned in a region of low electrostatic field strength or where the electrostatic field is absent, for example associated (e.g. in or on) the adjacent plate electrode array that faces away from all other electrodes of the objective lens array 242. Each of the beam-limiting apertures 124 is aligned with a corresponding objective lens in the objective lens array 241. The alignment is such that a portion of a sub-beam from the corresponding objective lens can pass through the beam-limiting aperture 124 and impinge onto the sample 208. Each beam-limiting aperture 124 has a beam limiting effect, allowing only a selected portion of the sub-beam incident onto the beam shaping limiter 242 to pass through the beam-limiting aperture 124. The selected portion may be such that only a portion of the respective sub-beam passing through a central portion of respective apertures in the objective lens array reaches the sample. The central portion may have a circular cross-section and/or be centered on a beam axis of the sub-beam.

In some embodiments, the electron-optical system further comprises an upper beam limiter 252. The upper beam limiter 252 defines an array of beam-limiting apertures. The upper beam limiter 252 may be referred to as an upper beam-limiting aperture array or up-beam beam-limiting aperture array. The upper beam limiter 252 may comprise a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

In embodiments not comprising a condenser lens array, as exemplified in FIGS. 10 and 11, the upper beam limiter 252 may form part of the objective lens array assembly. The upper beam limiter 252 may, for example, be adjacent to and/or integrated with the control lens array 250 (e.g. adjacent to and/or integrated with an electrode 603 of the control lens array 250 nearest to the source 201 as shown in FIG. 13). The upper beam limiter 252 may be the most-up-beam electrode of the control lens array 250. In some embodiments, the upper beam limiter 252 defines beam-limiting apertures that are larger (e.g. have larger cross-sectional area) than beam-limiting apertures 124 of the beam shaping limiter 242. The beam-limiting apertures 124 of the beam shaping limiter 242 may thus be of smaller dimension (i.e. smaller area and/or smaller diameter and/or smaller other characteristic dimension) than the corresponding apertures defined in the upper beam limiter 252 and/or in the objective lens array 241 and/or in the control lens array 250.

In embodiments having a condenser lens array 231, as exemplified in FIG. 3, upper beam limiter 252 may be provided adjacent to and/or integrated with the condenser lens array 231 (e.g. adjacent to and/or integrated with an electrode of the condenser lens array 231 nearest to the source 201). It is desirable generally to configure the beam-limiting apertures of the beam shaping limiter 242 to be smaller than beam-limiting apertures of all other beam limiters defining beam-limiting apertures up-beam from the beam shaping limiter 242. That is, the sub-beams may be derived from the beam (i.e. the beam of charged particles from the source 201), for example, using a beam limiter defining an array of beam-limiting apertures. The upper beam limiter 252 is such a beam limiting aperture array that may be associated with or part of the condenser lens array 231.

The beam shaping limiter 242 is desirably configured to have a beam-limiting effect (i.e. to remove a portion of each sub-beam that is incident on the beam shaping limiter 242). The beam shaping limiter 242 may, for example, be configured to ensure that each sub-beam exiting an objective lens of the objective lens array 241 has passed through the center of the respective objective lens. In contrast to alternative approaches, this effect can be achieved using the beam shaping limiter 242 without requiring a complex alignment procedure to ensure that sub-beams incident onto the objective lenses are well aligned with the objective lenses. Moreover, the effect of the beam shaping limiter 242 will not be disrupted by column alignment actions, source instabilities or mechanical instabilities. Further the beam shaping limiter 242 reduces the length over which the scanning operates on the sub-beams. The distance is reduced to the length of the beam path from the beam shaping limiter 242 to the sample surface.

In some embodiments, a ratio of a diameter of a beam-limiting aperture in the upper beam limiter 252 to a diameter of the corresponding beam-limiting aperture 124 in the beam shaping limiter 242 is equal to or greater than 3, optionally equal to or greater than 5, optionally equal to or greater than 7.5, optionally equal to or greater than 10. In one arrangement, for example, a beam-limiting aperture in the upper beam limiter 252 has a diameter of about 50 microns and a corresponding beam-limiting aperture 124 in the beam shaping limiter 242 has a diameter of about 10 microns. In another arrangement, a beam-limiting aperture in the upper beam limiter 252 has a diameter of about 100 microns and a corresponding beam-limiting aperture 124 in the beam shaping limiter 242 has a diameter of about 10 microns. It is desirable for only the part of the beam that has gone through the center of the objective lens to be selected by the beam-limiting aperture 124. In the example shown in FIG. 13, each objective lens is formed by the electrostatic field between electrodes 301 and 302. In some embodiments, each objective lens consists of two elementary lenses (each with focal length=4*beamEnergy/Efield): one at the bottom of electrode 301 and one at the top of electrode 302. The dominant lens may be the one at the top of electrode 302 (as the beam energy may be small there, for example 2.5 kV compared to 30 kV close to electrode 301, which would make the lens approximately 12× stronger than the other). It is desirable for the portion of the beam passing though the center of the aperture at the top of electrode 302 to be passing through beam-limiting aperture 124. Because the distance in z between the top of electrode 302 and the aperture 124 is very small (typically 100 to 150 microns for example), even for relatively large angles of the beam the correct portion of the beam is selected. The field strength in the objective lens array may desirably be predetermined.

In the particular example of FIGS. 12 and 13, the beam shaping limiter 242 is shown as an element formed separately from a bottom electrode 302 of the objective lens array 241. In other embodiments, the beam shaping limiter 242 may be formed integrally with a bottom electrode of an objective lens array 241 (e.g. by performing lithography to etch away cavities suitable for functioning as lens apertures and beam-blocking apertures on opposite sides of the substrate).

In some embodiments, the apertures 124 in the beam shaping limiter 242 are provided at a distance down-beam from at least a portion of a corresponding lens aperture in a bottom electrode of the corresponding objective lens array 241 by a distance equal to or larger than a diameter of the lens aperture, preferably at least 1.5 times larger than the diameter of the lens aperture, preferably at least 2 times larger than a diameter of the lens aperture.

It is generally desirable to position the beam shaping limiter 242 adjacent to the electrode of each objective lens that has the strongest lensing effect. In the example of FIGS. 12 and 13, the bottom electrode 302 will have the strongest lensing effect and the beam shaping limiter 242 is positioned adjacent to this electrode. Where an objective lens array 241 comprises more than two electrodes, such as in an Einzel lens configuration with three electrodes, the electrode having the strongest lensing effect will typically be the middle electrode. In this case, it would be desirable to position the beam shaping limiter 242 adjacent to the middle electrode. Thus, at least one of the electrodes of the objective lens array 241 may be positioned down-beam of the beam shaping limiter 242. The electron-optical system may also be configured to control the objective lens assembly (e.g. by controlling the potentials applied to the electrodes of the objective lens array) so that the beam shaping limiter 242 is adjacent to or integrated with an electrode of the objective lens array 241 having the strongest lensing effect of the electrodes of the objective lens array 241.

It is generally desirable also to position the beam shaping limiter 242 in a region where the electric field is small, preferably in a substantially field-free region. This avoids or minimizes disruption of a desired lensing effect by the presence of the beam shaping limiter 242.

It is desirable to provide the beam shaping limiter 242 up-beam of the detector (e.g. detector array 402), as exemplified in FIGS. 12 and 13. Providing the beam shaping limiter 242 up-beam of the detector ensures that the beam shaping limiter 242 will not obstruct charged particles emitted from the sample 208 and prevent them from reaching the detector. In embodiments where the detector is provided up-beam of all of the electrodes of the objective lens array 241, it is therefore desirable also to provide the beam shaping limiter 242 up-beam of all of the electrodes of the objective lens array 241 or even up-beam of one or more of the electrodes of the control lens array 250. In this scenario, it may be desirable to position the beam shaping limiter 242 as close as possible to the objective lens array 241 while still being up-beam of the detector. The beam shaping limiter 242 may thus be provided directly adjacent to the detector in the up-beam direction.

Objective lens array assemblies described above that have a beam shaping limiter 242 down-beam from at least one electrode of a control lens array 250 and/or at least one electrode of an objective lens array 241 are examples of a class of objective lens arrangement. Embodiments of this class comprise an objective lens arrangement for an electron-optical system for focusing a multi-beam on a sample 208. The objective lens arrangement comprises an up-beam lensing aperture array (e.g. an electrode 302 or 121 of the objective lens array 241 nearest to the source 201, as depicted in FIG. 12). The objective lens arrangement further comprises a down-beam lensing aperture array (e.g. an electrode 122 of the objective lens array 241 furthest from the source 201, as depicted in FIG. 12). The down-beam lensing aperture array (e.g. electrode 302) and the up-beam lensing aperture array (e.g. electrode 301) operate together to lens sub-beams of the multi-beam. A beam-limiting aperture array (e.g. the beam shaping limiter 242 depicted in FIG. 12) is provided in which the apertures (e.g. the beam-limiting apertures 124 in FIG. 12) are of smaller dimension (i.e. smaller area and/or smaller diameter and/or smaller other characteristic dimension) than apertures in the up-beam lensing aperture array and the down-beam lensing aperture array. The apertures of the beam-limiting aperture array are configured to limit each sub-beam to a portion of the sub-beam that has passed through central portions of respective apertures in the up-beam lensing aperture array and the down-beam lensing aperture array. As described above, the beam-limiting aperture array may thus ensure that each sub-beam exiting an objective lens of the objective lens arrangement has passed through the center of the respective lens.

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies and or current supplies) to control the component to manipulate the charged particle beam in this manner. For example, a voltage supply may be electrically connected to one or more components to apply potentials to the components, such as in a non-limited list the control lens array 250, the objective lens array 241, the condenser lens 231, correctors, collimator element array 271 and scan deflector array 260, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic, for example the objective lens array and the control lens array. One or more of the following elements may be electrostatic: the condenser lens 231, correctors, collimator element array 271 and scan deflector array 260, under the control of the controller or control system or control unit. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

An assessment tool according to some embodiments may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron-optical column 40 may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

At least some embodiments are set out in the following numbered clauses:

Clause 1: A multi-beam electron-optical system for a charged-particle assessment tool, the system comprising: a plurality of control lenses, each configured to control a parameter of a respective sub-beam; a plurality of objective lenses, each configured to project one of the plurality of charged-particle beams onto a sample; and a controller configured to control the control lenses and the objective lenses so that the charged particles are incident on the sample with a desired landing energy, demagnification and/or beam opening angle.

Clause 2: A system according to clause 1 wherein the controller is configured to maintain a predetermined e-field or electric field in the objective lenses.

Clause 3: A system according to clause 1 or 2 wherein the control lenses are configured to adjust the demagnification and/or beam opening angle of respective sub-beams and/or to control a landing energy of respective sub-beams on the sample surface.

Clause 4: A system according to clause 1, 2 or 3 wherein the control lenses are upbeam of and associated with the objective lenses.

Clause 5: A system according any preceding clause, wherein the controller is configured to control the control lenses to control the parameter of a pre-focus of the respective sub-beams so that at one or more of: a combined action on the respective objective lenses and of the respective control lenses determines the focus position of the respective sub-beams on the sample, a combined lens effect on the respective sub-beams by the respective objective lenses and the respective control lenses leads to a focus on the sample, a combined lens effect of the respective sub-beams by the respective objective lenses and the respective control lenses leads to a focus on the sample, and the respective objective lenses and the respective control lenses together focus the respective sub-beams on the sample; alternatively or additionally the controller is configured to control the objective lenses to focus the respective sub-beams on the sample and to control the control lenses to control the parameter of a pre-focus of the respective sub-beams so that the pre-focus of the respective sub-beams is prior to the focus of the respective sub-beams by the objective lens on the sample; preferably the position of the sample (preferably along the paths of the respective sub-beams) at the combined focal length: maintains a spacing, preferably a minimum spacing, between the sample and the objective lens array; and/or corresponds to a distance between a detector and the sample preferably to maintain a spacing such as minimum spacing between the detector and the sample.

Clause 6: A system according any preceding clause wherein control of the control lens and the respective objective lens determines the focus position of the focus of each sub-beam; preferably the focus positions of the respective sub-beams by the control lens array may be down-beam of the objective lens array, preferably the control lens is configured to have a focal length, and preferably so that the focal length of the combined focal length of control lenses and the corresponding objective lenses are controlled by the controller.

Clause 7: A system of any preceding clause, wherein the controller is configured to apply a potential difference to adjoining electrodes of the objective lens array that are largest potential difference between two adjoining electrodes of the: objective lenses and control lenses along a path of each of the charged particle beans; or of the objective lens arrangement, the objective lens arrangement comprising an array of the control lenses and an array of the objective lenses, the control lenses preferably being up-beam of the objective lenses.

Clause 8: A system according to any preceding clause, wherein the plurality of control lenses and/or the plurality of objective lenses are configured to be replaceable, preferably field replaceable.

Clause 9: A system according to clause 8 comprising a replaceable module comprising the plurality of control lenses and/or the plurality of objective lenses so that the plurality of control lenses and/or the plurality of objective lenses are replaceable, preferably field replaceable, on replacement of the module.

Clause 10: A multi-beam electron-optical system for a charged-particle assessment tool, the system comprising: a control lens array, comprising a plurality of control electrodes and configured to control a parameter of a respective sub-beam; an objective lens array comprising a plurality of objective electrodes and configured to direct the plurality of charged-particle beams onto a sample; and a potential source system configured to apply relative potentials to the control electrodes and objective electrodes so that the charged particles are incident on the sample with a desired landing energy, demagnification and/or beam opening angle.

Clause 11: A multi-beam electron-optical system for a charged-particle assessment tool, the system comprising: an objective lens array comprising objective lenses configured to focus respective sub-beams onto a sample surface; and a control lens array comprising control lenses configured to control a landing energy of respective sub-beams on the sample surface and/or to optimize an opening angle and/or magnification of respective sub-beams prior to operation of the objective lens array.

Clause 12: A system according to clause 11 wherein the control lens comprises at least two electrodes along the beam path.

Clause 13: A system according to clause 12 wherein at least one of the electrodes is configured to set beam energy of the respective sub-beams, said electrode preferably down-beam from a first electrode in the beam path.

Clause 14: A system according to clause 12 or 13 wherein the at least one of the electrodes is configured to control the opening angle and/or magnification of the respective sub-beams, said electrode preferably down-beam from a first electrode in the beam path, preferably upbeam of an electrode configured to control the beam energy.

Clause 15: A multi-beam electron-optical system for an inspection tool, the system comprising: an objective lens array configured to focus a plurality of collimated sub-beams on a sample; a control lens array up-beam of the objective lens array, the control lens array configured to control the beam energy of each sub-beam, wherein the system is configured to adjust the landing energy of the sub-beams on the sample.

Clause 16: A system according to clause 15 wherein the system is configured to adjust the landing energy by changing the potentials applied to the objective lens array while keeping the electrostatic field in the objective lens at a preselected strength.

Clause 17: A system according to clause 15 or 16 wherein the system is configured to adjust the landing energy by controlling the control lens array so as to vary the beam energy delivered by the control lens array to the objective lens array.

Clause 18: A system according to clause 15, 16 or 17 wherein controlling the control lens comprises re-optimizing the opening angle and demagnification.

Clause 19: A system according to any one of the preceding clauses wherein each objective lens comprises two electrodes.

Clause 20: A multi-beam electron-optical system for a charged-particle assessment tool, the system comprising an objective lens array assembly comprising a plurality of aperture arrays, the objective lens array assembly configured to: a) focus a plurality of sub-beams on a sample; and b) control another parameter of the sub-beams, the parameter being at least one of: landing energy of the sub-beams on the sample surface, opening angle of respective sub-beams and/or magnification of respective sub-beams.

Clause 21: The system of clause 20, wherein aperture arrays proximate to a sample are configured to focus the plurality of beams on the sample.

Clause 22: The system of clause 21, wherein at least two aperture arrays are proximate the sample.

Clause 23: The system of any of clauses 20 to 22, wherein aperture arrays confirmed to control the other parameter are upbeam of aperture arrays configured to control the focus of the sub-beams.

Clause 24: The system of clause 23, wherein at least two aperture arrays are configured to control the other parameter.

Clause 25: The system of clause 24, wherein the aperture arrays configured to control the other parameter comprises an aperture configured to control landing energy.

Clause 26: The system of clause 24 or 25, wherein the aperture array configured to control the other parameter comprises an aperture array configured to optimize the opening angle of respective sub-beams and/or magnification of respective sub-beams; preferably the aperture array is the same as the aperture configured to control landing energy.

Clause 27: A system according to any one of the preceding clauses further comprising a detector configured to detect charged-particles emitted from the sample, the detector preferably comprising a plurality of detector elements, the plurality of detector elements preferably associated with respective sub-beams and the detector may be spaced away from the sample by a distance away from the sample, preferably the distance away from the sample is an optimum distance or a range of the detector.

Clause 28: A system according to clause 27, wherein the detector being associated with the objective lens array and, desirably, between the plurality of objective lenses and the sample.

Clause 29: A system according to any one of the preceding clauses, wherein at least the objective lenses (or objective lens array) and the control lenses (or control lens array) are electrostatic; preferably all charged particle-optical elements of the system are electro-static.

Clause 30: A system according to any of the preceding clauses, wherein the charged particles are electrons, preferably the system comprising an electron source for emitting for emitting electrons.

Clause 31: A charged-particle assessment tool comprising a multi-beam electron-optical system according to any one of the preceding clauses, the charged particle assessment tool preferably comprising a condenser lens, the condenser lens being up beam of the objective lens array and control lens array, the condenser lens preferably being a condenser lens array or alternatively a macro condenser lens which is preferably magnetic.

Clause 32: An inspection method comprising: using a plurality of control lenses to control a parameter of a respective one of a plurality of sub-beams of charged particles; using a plurality of objective lenses to project the plurality of charged-particle beams onto a sample; and controlling the control lenses and the objective lenses so that the charged particles are incident on the sample with a desired landing energy, demagnification and/or beam opening angle.

Clause 33: A method of projecting a plurality of sub-beams onto a sample surface by use of an objective lens array assembly, the method comprising: a) projecting the sub-beams onto a surface of a sample; and b) controlling the landing energy of the sub-beams and/or optimizing the demagnification and/or beam opening angle of said sub-beams.

Clause 34: The method of clause 33, the objective lens array assembly comprising an array of control lenses, each control lens for controlling a parameter of a respective sub-beam; and an array of objective lenses, each objective lens for projecting a respective sub-beam onto a sample; a controller for control the control lenses and the objective lenses; and a detector for detecting charged-particles emitted from the sample the detector comprising a plurality of detector elements associated with respective sub-beams and the detector being spaced away from the sample by a distance away from the sample; wherein the projecting using the objective lens array and the controlling comprising controlling the landing energy of the sub-beams so that the sub-beams are incident on the sample with a desired landing energy; the method preferably further comprising: controlling the control lenses to control the parameter comprises pre-focusing the respective sub-beams so that at one or more of: 1) a combined action on the respective objective lenses and of the respective control lenses determines the focus position of the respective sub-beams on the sample, 2) a combined lens effect on the respective sub-beams by the respective objective lenses and the respective control lenses leads to a focus on the sample, 3) a combined lens effect of the respective sub-beams by the respective objective lenses and the respective control lenses leads to a focus on the sample, and 4) the respective objective lenses and the respective control lenses together focus the respective sub-beams on the sample, (alternatively or additionally the controller is configured to control the objective lenses to focus the respective sub-beams on the sample and to control the control lenses to control the parameter of a pre-focus of the respective sub-beams so that the pre-focus of the respective sub-beams is prior to the focus of the respective sub-beams by the objective lens on the sample); and detecting charged-particles emitted from the sample, wherein preferably the controlling of the control lenses and the objective lenses is by the controller and preferably the detecting by the detector.

Clause 35: The method of clause 33 to 34, the objective lens array assembly comprising an objective lens array configured to project a beam of charged particles on to the same Clause 36: The method of clauses 33 to 35 comprising: maintaining a predetermined electrostatic-field or e-field in the objective lens array.

Clause 37: The method of clause 33 to 36 further comprising: adjusting the demagnification and/or beam opening angle of respective sub-beams.

Clause 38: The method of any of clauses 33 to 37 further comprising: e) adjusting the landing energy of respective sub-beams on the sample surface.

Clause 39: The method of any of clauses 33 to 38 further comprising further comprising detecting charged-particles emitted from the sample.

Clause 40: The method of clause 39, wherein the detecting uses a detector associated with the objective lens array assembly.

Clause 41: The method of clause 40, wherein the detecting is between the plurality of objective lenses and the sample.

Clause 42: The method of any of clauses 33 to 41, wherein in pre-focusing the control lens so as to focus the respective sub-beams on the sample maintaining a minimum spacing between the sample and: the objective lens array and/or the detector.

Clause 43: The method of any of clauses 33 to 42, further comprising collimating the beam of charged particles.

Clause 44: The method of clause 43, wherein the collimating uses a macro collimator up-beam of the objective lens array assembly Clause 45: The method of clause 43, wherein the collimating uses a collimator array within the objective lens array assembly.

Clause 46: The method of any of clauses 33 to 45, further comprising replaceably removing at least a lens element of the objective lens assembly.

Clause 47: The method of clause 46 comprising venting a section a section of the column, the section preferably corresponding to a module comprising at least the lens element of the objective lens assembly and optionally at least one of: removing the module, returning the module into the section and replacing the module; the method further comprising depressurizing the section.

Clause 48: The method of clause 46 or 47, the method comprising swapping a module comprising at least the element between an operable and non-operable position, wherein in the operatable position the module is the section of the column and optionally swapping the module with another module in a non-operable position so that the module is moved to a non-operable position preferably the other module is moved into the section so that it is in an operable position.

Clause 49: A replaceable module configured to be replaceable in a charged particle column such as an electron-optical column of a charged particle inspection tool, the module comprising an objective lens array assembly comprising a plurality of control lenses configured to control a parameter of a respective sub-beam, the parameters comprising the demagnification and/or landing energy of a multi-beam; preferably the replaceable module is field replaceable.

Clause 50: The replaceable module of clause 49, wherein the objective lens array assembly comprises: a plurality of objective lenses configured to project a respective charged beam of the multi-beam onto a sample; and a detector configured to detect charged-particles emitted from the sample, the detector preferably comprising a plurality of detector elements associated with respective sub-beams and the detector being configured on placement of the module in an electron-optical column to be spaced away from the sample by a distance away from the sample, wherein the control lenses and the objective lenses are preferably configured to be controlled so that the charged particles are incident on the sample with a desired landing energy and/or demagnification, and the control lenses are preferably configured, on placement of the module in an electron-optical column, to be preferably controlled to control the parameter of a pre-focus of the respective sub-beams so that at one or more of: 1) a combined action on the respective objective lenses and of the respective control lenses determines the focus position of the respective sub-beams on the sample, 2) a combined lens effect on the respective sub-beams by the respective objective lenses and the respective control lenses leads to a focus on the sample, 3) a combined lens effect of the respective sub-beams by the respective objective lenses and the respective control lenses leads to a focus on the sample, and 4) the respective objective lenses and the respective control lenses together focus the respective sub-beams on the sample; (alternatively or additionally the controller is configured to control the objective lenses to focus the respective sub-beams on the sample and to control the control lenses to control the parameter of a pre-focus of the respective sub-beams so that the pre-focus of the respective sub-beams is prior to the focus of the respective sub-beams by the objective lens on the sample).

While the present invention has been described in connection with various embodiments, other embodiments will be apparent to those skilled in the art from consideration of the specification and practice of the technology disclosed herein. It is intended that the specification and examples be considered as exemplary only, with a true scope and spirit of the invention being indicated by the following claims.

The invention claimed is:

1. A multi-beam electron-optical system for a charged-particle assessment tool, the system comprising:

a plurality of control lenses, each configured to control a parameter of a respective sub-beam of a plurality of sub-beams;

a plurality of objective lenses, each configured to project a respective one of the plurality of sub-beams onto a sample;

a detector configured to detect charged-particles emitted from the sample, the detector comprising a plurality of detector elements associated with respective sub-beams and the detector being spaced away from the sample by a distance away from the sample; and a controller configured to control the plurality of control lenses and the plurality of objective lenses so that the charged particles are incident on the sample with a desired landing energy and/or demagnification;

wherein the controller is configured to control the plurality of control lenses to control the parameter of a pre-focus of the respective sub-beams so that a combined action on the respective sub-beams by the respective objective lenses and the respective control lenses determines a focus position of the respective sub-beams on the sample.

2. The system of claim 1, wherein the controller is configured to maintain a predetermined electrostatic-field in the plurality of objective lenses.

3. The system of claim 1, wherein the controller is configured to apply a potential difference to adjoining electrodes of the plurality of objective lenses that is the largest potential difference between any of two adjoining electrodes of: the plurality of objective lenses, and the plurality of control lenses along a path of each of the plurality of sub-beams.

4. The system of claim 1, wherein the plurality of control lenses are configured to adjust the demagnification of respective sub-beams and/or to control a landing energy of respective sub-beams on a surface of the sample.

5. The system of claim 1, wherein the plurality of control lenses are upbeam of and associated with the plurality of objective lenses.

6. The system of claim 1, wherein the plurality of control lenses and/or the plurality of objective lenses are configured to be replaceable.

7. The system of claim 6, further comprising a replaceable module comprising the plurality of control lenses and/or the plurality of objective lenses so that the plurality of control lenses and/or the plurality of objective lenses are replaceable on replacement of the replaceable module.

8. The system of claim 1, wherein the plurality of objective lenses are an array objective lenses comprising at least two plates each with a plurality of apertures.

9. The system of claim 8, wherein a position of each aperture in a plate of the at least two plates corresponds to a position of a corresponding aperture in another of the at least two plates.

10. The system of claim 8, wherein the detector is configured to be positioned down-beam of at least one of the at least two plates of the array of objective lenses.

11. The system of claim 1, wherein the plurality of control lenses comprises a plurality of plates in which a plurality of apertures are defined.

12. The system of claim 1, wherein the detector is configured to be positioned between the plurality of objective lenses and the sample and/or the distance that the detector is spaced away from the sample is a range of the detector.

13. A method of projecting a plurality of sub-beams onto a sample surface by use of an objective lens array assembly comprising an array of control lenses, each control lens for controlling a parameter of a respective sub-beam; and an array of objective lenses, each objective lens for projecting the respective sub-beam onto a sample; a controller for controlling the array of control lenses and the array of objective lenses; and a detector for detecting charged-particles emitted from the sample, the detector comprising a plurality of detector elements associated with respective sub-beams and the detector being spaced away from the sample by a distance away from the sample; the method comprising:

a) projecting the plurality of sub-beams onto a surface of a sample, the projecting using the array of objective lenses;

b) controlling a landing energy of the plurality of sub-beams so that the plurality of sub-beams are incident on the sample with a desired landing energy and/or optimizing a demagnification of said plurality of sub-beams;

c) controlling the array of control lenses to control the parameter comprises pre-focusing the respective sub-beams so that a combined action on the respective sub-beams by the respective objective lenses and the respective control lenses is on the sample; and d) detecting charged-particles emitted from the sample, wherein the controlling of the control lenses and the objective lenses is done by the controller and the detecting is done by the detector.

14. The method of claim 13, further comprising: adjusting the demagnification of respective sub-beams.

15. The method of claim 13, further comprising: maintaining a predetermined e-field in the array of objective lenses.

16. The method of claim 13, further comprising:

adjusting the landing energy of respective sub-beams on the sample surface.

17. The method of claim 13, wherein the detector is between the array of objective lenses and the sample.

18. The method of claim 13, wherein in pre-focusing the array of control lenses so as to focus the respective sub-beams on the sample maintaining a minimum spacing between the sample and the array of objective lenses.

19. The method of claim 13, further comprising collimating the plurality of sub-beams.

20. A replaceable module configured to be replaceable in a charged particle-optical column of a charged particle inspection tool, the replaceable module comprising: an objective lens array assembly comprising:

a plurality of control lenses configured to control a parameter of a respective sub-beam of a multi-beam, the parameters comprising demagnification and/or landing energy of the multi-beam, and a plurality of objective lenses configured to project a respective sub-beam of the multi-beam onto a sample; and a detector configured to detect charged-particles emitted from the sample, the detector comprising a plurality of detector elements associated with respective sub-beams of the multi-beam and the detector being configured on placement of the replaceable module in an electron-optical column to be spaced away from the sample by a distance away from the sample, wherein the plurality of control lenses and the plurality of objective lenses are configured to be controlled so that the charged particles are incident on the sample with a desired landing energy and/or demagnification, and the plurality of control lenses are configured, on placement of the replaceable module in an electron-optical column, to be controlled to control the parameter of a pre-focus of the respective sub-beams so that a combined action on the respective sub-beams by the respective objective lenses and the respective control lenses determines a focus position of the respective sub-beams on the sample.

* * * * *